(12) United States Patent
Kim et al.

(10) Patent No.: US 8,947,935 B2
(45) Date of Patent: Feb. 3, 2015

(54) INTEGRATED CIRCUIT AND APPARATUSES INCLUDING THE SAME

(71) Applicant: SAMSUNG Electronics Co., Ltd., Suwon-si, Gyeonggi-do (KR)

(72) Inventors: Eui-Seung Kim, Hwaseong-si (KR); Ji-Sung Kim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 8 days.

(21) Appl. No.: 13/835,780

(22) Filed: Mar. 15, 2013

(65) Prior Publication Data

US 2013/0322177 A1    Dec. 5, 2013

(30) Foreign Application Priority Data

May 30, 2012    (KR) .................. 10-2012-0057256

(51) Int. Cl.
G11C 11/34    (2006.01)
G11C 7/12     (2006.01)
G11C 16/24    (2006.01)

(52) U.S. Cl.
CPC . *G11C 7/12* (2013.01); *G11C 16/24* (2013.01)
USPC ................. 365/185.17; 365/185.24

(58) Field of Classification Search
USPC ..................... 365/185.17, 185.24
See application file for complete search history.

(56) References Cited

U.S. PATENT DOCUMENTS

| | | | |
|---|---|---|---|
| 5,680,357 A | 10/1997 | Sung et al. | |
| 5,781,489 A | 7/1998 | Okamoto | |
| 6,021,072 A * | 2/2000 | Takeda et al. | ............ 365/189.11 |
| 6,366,497 B1 | 4/2002 | Guliani et al. | |
| 6,449,191 B1 | 9/2002 | Lin et al. | |
| 6,845,052 B1 | 1/2005 | Ho et al. | |
| 7,512,026 B2 | 3/2009 | O | |
| 2009/0213667 A1* | 8/2009 | Kubo et al. | ............ 365/189.09 |
| 2011/0280088 A1* | 11/2011 | Adams et al. | ............ 365/189.11 |

FOREIGN PATENT DOCUMENTS

| | | |
|---|---|---|
| JP | 2005259301 | 9/2005 |
| KR | 1020020096746 | 12/2002 |

* cited by examiner

*Primary Examiner* — Michael Tran
(74) *Attorney, Agent, or Firm* — Elsworth IP Group PLLC

(57) ABSTRACT

An integrated includes a memory cell, a bit line connected to the memory cell, a boosting circuit to boost the bit line up to a boosting voltage during a pre-charge operation pre-charging the bit line, and a regulation circuit connected between the bit line and an output terminal and determines a logic level of the output terminal according to the voltage of the bit line.

18 Claims, 12 Drawing Sheets

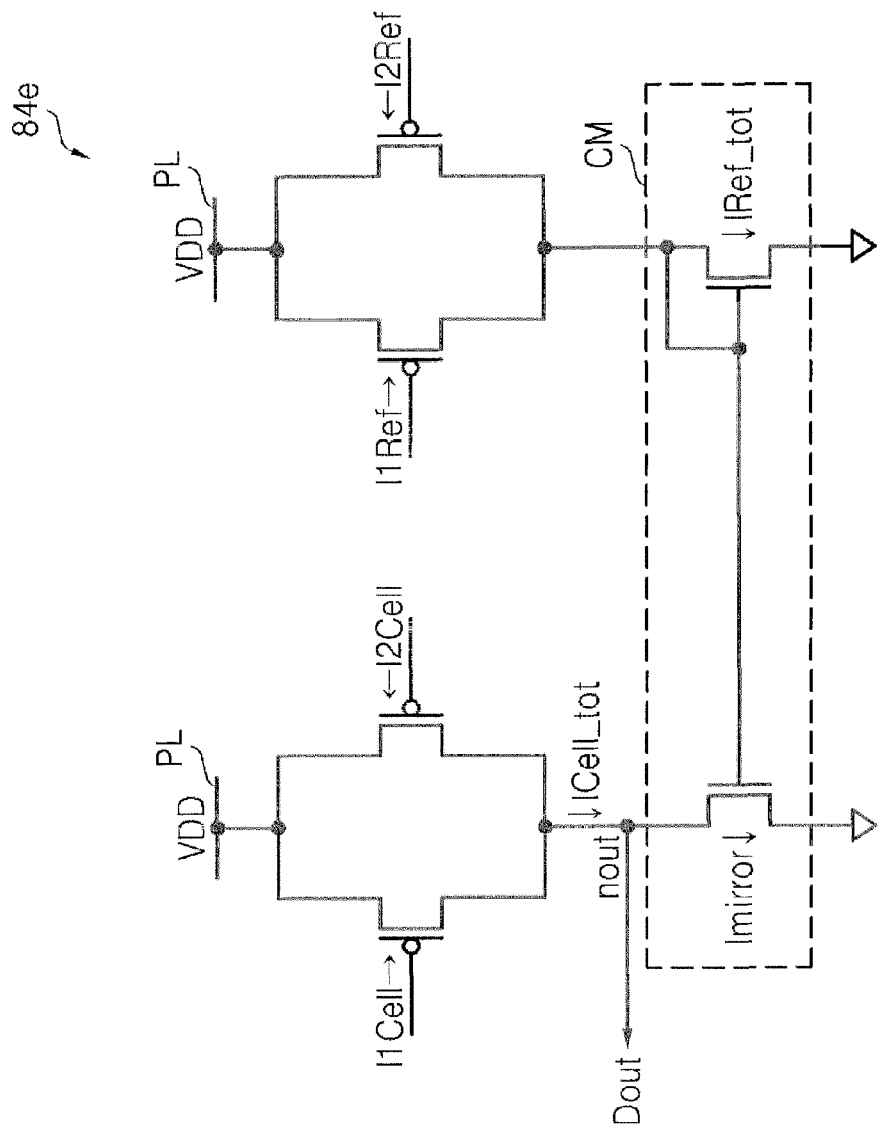

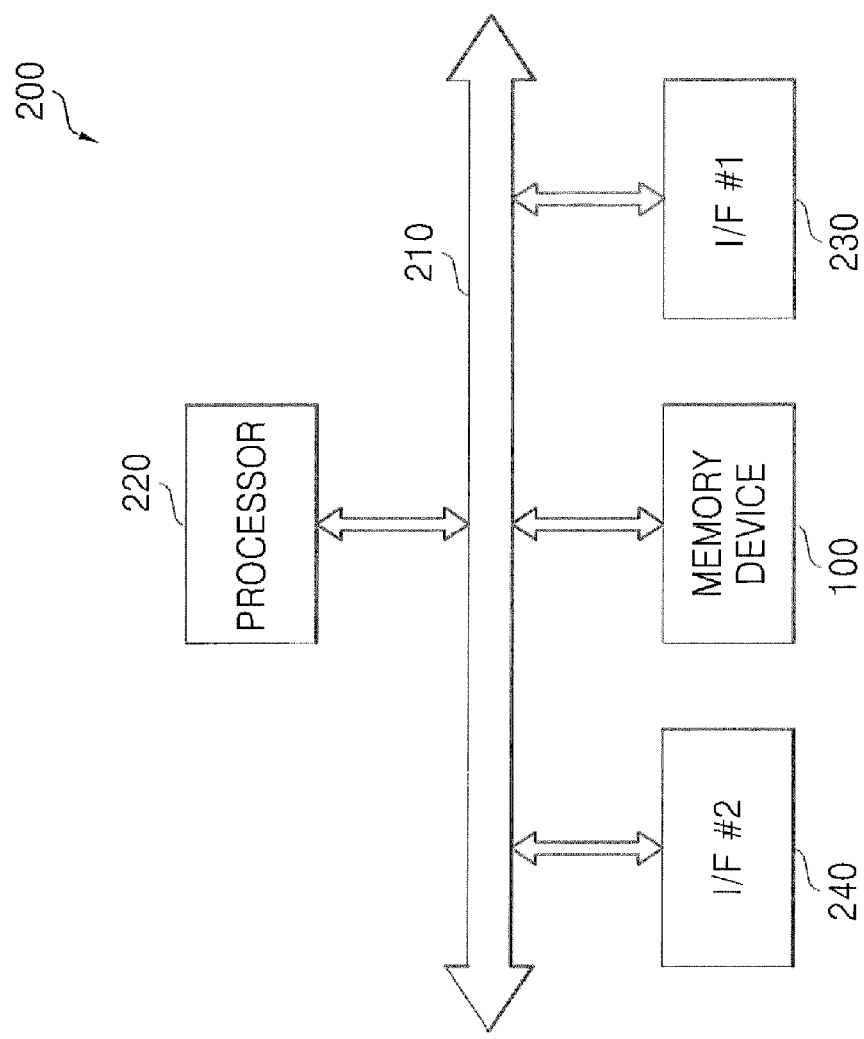

US 8,947,935 B2

INTEGRATED CIRCUIT AND APPARATUSES INCLUDING THE SAME

CROSS-REFERENCE TO RELATED APPLICATIONS

This application claims priority under 35 U.S.C. §119(a) from Korean Patent Application No. 10-2012-0057256 filed on May 30, 2012, the disclosure of which is hereby incorporated by reference in its entirety.

BACKGROUND OF THE INVENTION

1. Field of the Invention

Embodiments relates to an integrated circuit, and more particularly, to an integrated circuit including a boosting circuit to boost a bit line to a boosting voltage, and apparatuses including the same.

2. Description of the Related Art

A memory is divided into a volatile memory and a non-volatile memory according to the period in which data is being retained inside the memory.

A non-volatile memory includes read only memory (ROM), flash memory, and the like. The ROM includes programmable ROM (PROM), mask ROM, and the like.

The PROM may be sold in a state that data is not programmed thereon when manufacturing so that a user himself may program necessary information thereon. The mask ROM may be sold in a state that data ordered by a user is programmed thereon in advance when manufacturing. The PROM may be divided into One Time PROM (OTPROM), Erasable PROM (EPROM), Electrically Erasable PROM (EEPROM), or the like.

Although there are many types of non-volatile memory, a flash memory is in the main stream more recently. The flash memory has a cell structure of accumulating electric charges in an electrode which is not electrically connected, for example, in a floating gate.

The flash memory includes a NAND type flash memory and a NOR type flash memory which are divided according to arrangement of bit lines and memory cells. The flash memory also includes an assist gate AND type (AG-AND) flash memory, a NROM type flash memory, or the like.

A sense amplifier may sense a state of a memory cell included in a memory device and amplify a signal generated according to the sensing result. For example, the sense amplifier may detect a current signal (or a voltage signal) output at the time of a read operation of the memory cell by using a reference current signal (or a reference voltage signal) and amplify a signal generated according to the detecting result. As the degree of integration of a memory device has been increasing, a sense amplifier capable of operating at a low voltage level is needed.

SUMMARY OF THE INVENTION

One or more embodiments herein may provide an integrated circuit including a memory cell, a bit line connected to the memory cell, a boosting circuit to boost the bit line to a boosting voltage during a pre-charge operation pre-charging the bit line, and a regulation circuit connected between the bit line and an output terminal and to determine a logic level of the output terminal according to the voltage of the bit line.

The integrated circuit may further include a pre-charge circuit to pre-charge the bit line in response to a pre-charge signal, and the pre-charge circuit may include a first pre-charge transistor connected between a power line providing a power voltage and the output terminal and a second pre-charge transistor connected between the power line and the boosting circuit.

The regulation circuit may include a regulation transistor connected between the bit line and the output terminal and an inverter connected between the bit line and a gate of the regulation transistor.

The integrated circuit may further include a pre-charge circuit to pre-charge the bit line in response to a pre-charge signal, and the pre-charge circuit may include a first pre-charge transistor connected between a power line providing a power voltage and the output terminal and a second pre-charge transistor connected between the bit line and the boosting circuit.

The regulation circuit may include a regulation transistor connected between the bit line and the output terminal and an inverter connected between the bit line and a gate of the regulation transistor.

The memory cell may be a NOR flash memory cell.

One or more embodiments may provide a system on chip (SoC) including an integrated circuit and a processor controlling the integrated circuit, wherein the integrated circuit may include a memory cell, a bit line connected to the memory cell, a boosting circuit to boost the bit line to a boosting voltage, and a regulation circuit connected between the bit line and an output terminal and to determine a logic level of the output terminal according to the voltage of the bit line.

One or more embodiments may also provide an integrated circuit including a first bit line connected to a memory cell, a first control circuit controlling a first pre-charge current provided to the first bit line according to a voltage of the first bit line during a pre-charge operation pre-charging the first bit line, a first boosting circuit to boost the first bit line to a first boosting voltage, and a detecting circuit to detect a state of the memory cell according to a comparison result between a first current related to a state of the memory cell and the second current related to a state of the reference memory cell during a sensing operation detecting a state of the memory cell.

The integrated circuit may further include a second bit line connected to the reference memory cell, a second control circuit to control a second pre-charge current provided to the second bit line according to a voltage of the second bit line during a pre-charge operation pre-charging the second bit line, and a second boosting circuit to boost the second bit line to a second boosting voltage.

The first current may be the sum of a current flowing through the first control circuit during the sensing operation and a current flowing through the first boosting circuit during the sensing operation, and the second current may be the sum of a current flowing through the second control circuit during the sensing operation and a current flowing through the second boosting circuit during the sensing operation.

The first boosting circuit may include a boosting transistor connected to a power line providing a power voltage and the first bit line, wherein a gate of the boosting transistor is connected to the detecting circuit, and the second boosting circuit may have the same structure with the first boosting circuit.

The boosting transistor may be a diode connected transistor.

The first control circuit may include a pre-charge transistor connected to a power line providing a power source voltage, a regulation transistor connected to the pre-charge transistor and the first bit line, and an inverter connected between a gate of the regulation transistor and the first bit line, wherein a gate of the pre-charge transistor is connected to the detecting circuit, and the second control circuit may have the same structure with the first control circuit.

The first control circuit may include a pre-charge transistor connected to a power line providing a power source voltage, a regulation transistor connected between the pre-charge transistor and the first bit line, and an inverter connected between a gate of the regulation transistor and the first bit line, a gate of the pre-charge transistor is connected to a ground, and the second control circuit may have the same structure with the first control circuit.

Each of the memory cell and the reference memory cell may be a NOR flash memory cell.

One or more embodiments may also provide a system on chip (SoC) including an integrated circuit and a processor to control the integrated circuit, wherein the integrated circuit may include a first bit line connected to a memory cell, a first control circuit to control a first pre-charge current provided to the first bit line according to a voltage of the first bit line during a pre-charging operation pre-charging the first bit line, a first boosting circuit to boost the first bit line with a first boosting voltage, and a detecting circuit to detect the state of the memory cell according to the comparison result between a first current related to the state of the memory cell and the second current related to the state of the reference memory cell during a sensing operation detecting a state of the memory cell.

One or more embodiments may also provide an integrated circuit, comprising: a bit line provide data to a memory cell; a boosting circuit to boost the bit line during a pre-charge operation pre-charging the bit line; and a regulation circuit connected between the bit line and an output terminal to determine a logic level of the output terminal according to a voltage level of the bit line.

In an exemplary embodiment, the regulation circuit comprises a regulation transistor and an inverter, the output of the inverter connected to a gate of the regulation transistor.

In another exemplary embodiment, the integrated circuit further comprises a pre-charge circuit to pre-charge the bit line in response to a pre-charge signal, the pre-charge circuit comprising: a first pre-charge transistor connected between a power line providing a power voltage and the output terminal; and a second pre-charge transistor connected between the power line and the boosting circuit.

In an exemplary embodiment, the boosting circuit is connected between the pre-charge circuit and the bit line.

In another exemplary embodiment, the pre-charge circuit includes a transistor connected between a power line and the boosting circuit.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 4C is a circuit diagram according to an exemplary embodiment of a detecting circuit included in the sense amplifier shown in FIG. 4A;

FIG. 6 is a block diagram of a memory system including the memory device shown in FIG. 1.

DETAILED DESCRIPTION OF THE PREFERRED EMBODIMENTS

Figure 1:
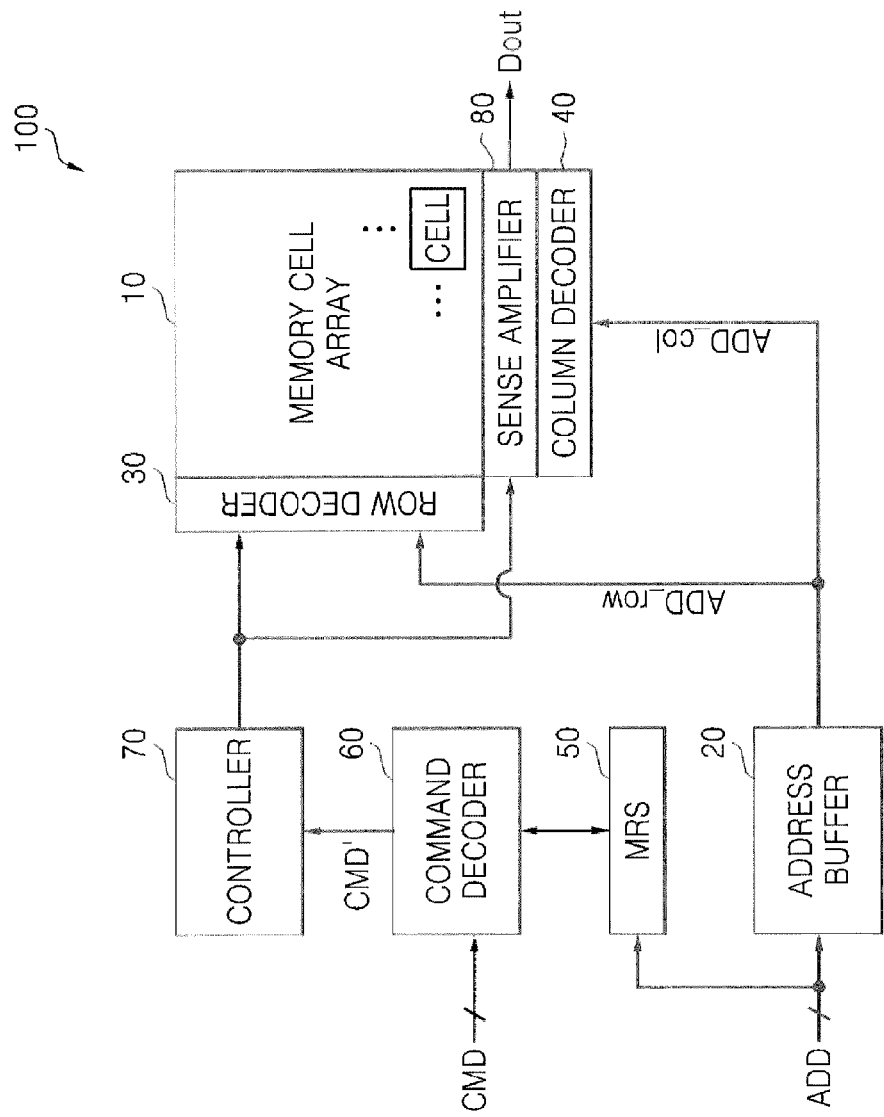
FIG. 1 is a block diagram of a memory device according to an exemplary embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the present general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory device according to an exemplary embodiment. Referring to FIG. 1, the memory device 100 includes a memory cell array 10, an address buffer 20, a row decoder 30, a column decoder 40, a mode register set (MRS) circuit 50, a command decoder 60, a controller 70, and a sense amplifier 80.

The memory cell array 10 includes a plurality of memory cells arranged in the form of two-dimensional matrix. Each of the memory cells stores data.

The data stored in the memory cell array 10 is read based on an address signal ADD, and the read data is output as a detecting signal Dout. The address signal ADD to select the memory cell storing data to be read is input through an address buffer 20. The address buffer 20 performs buffering the input address signal ADD. The address signal ADD may include a row address signal (ADD_row) and a column address signal (ADD_col).

The row decoder 30 performs decoding the row address signal (ADD_row) output from the address buffer 20 to select a word line connected to the memory cell storing data to be read. The column decoder 40 performs decoding a column address signal (ADD_col) output from the address buffer 20 to select a bit line connected to the memory cell storing data to be read.

The MRS circuit 50 may set a mode register (not shown) included in the memory device 100 based on an MRS command to select an operation mode of the memory device 100 and/or address signal (ADD).

The command decoder 60 receives a command signal CMD, performs decoding the received command signal CMD, and outputs the decoded command signal CMD'. The controller 70 may control the operation of the memory device 100 in response to the decoded command signal CMD' output from the command decoder 60.

The sense amplifier 80 detects a current signal or a voltage signal output from a memory cell (CELL) at the time of a read operation by using a reference current signal or a reference voltage signal and generates a detecting signal Dout based on the detecting result.

A structure and an operation of the sense amplifier 80 will be explained in FIGS. 2A through 5B in detail.

The memory device 100 further includes a clock circuit (not shown) to generate a clock signal and/or a power circuit (not shown) distributing voltage or to generate an internal voltage.

Figure 2A:
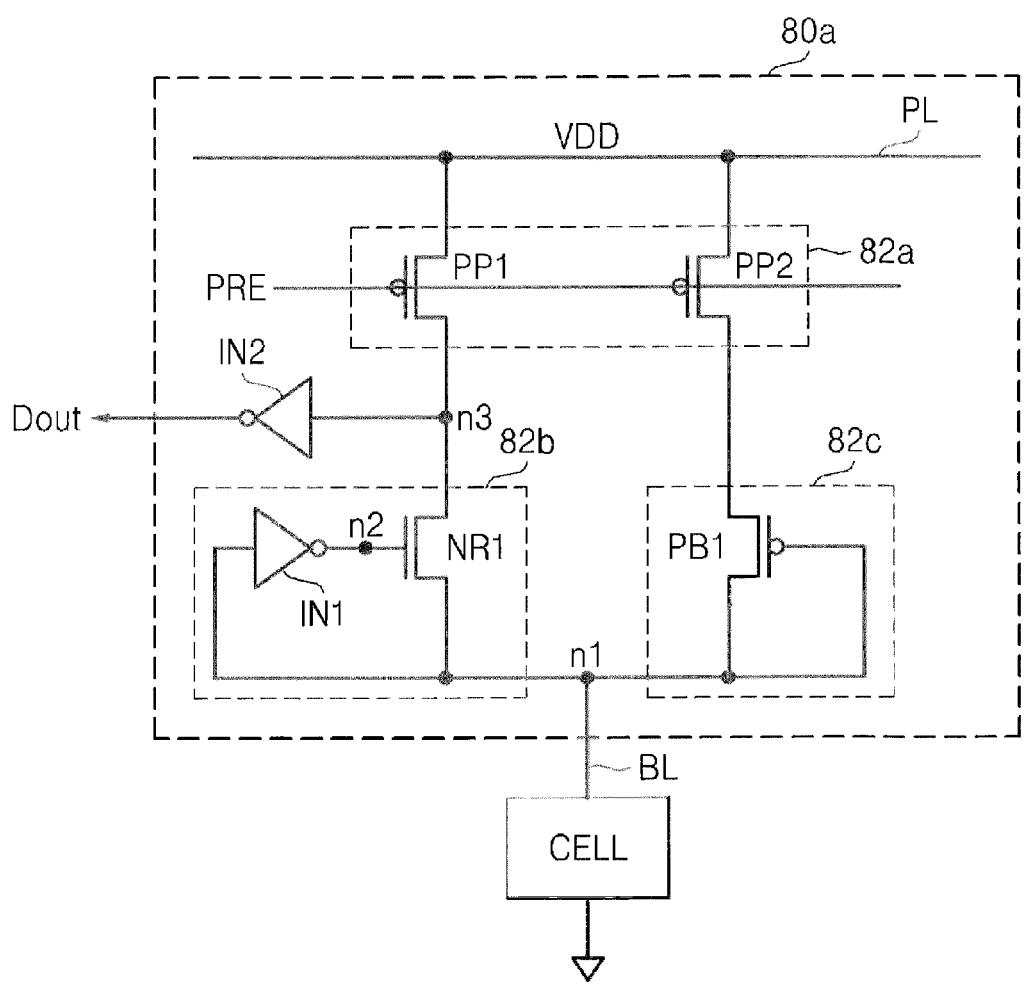
FIG. 2A is a circuit diagram according to exemplary embodiments of a sense amplifier included in a memory device shown in FIG. 1.

FIG. 2A is a circuit diagram according to exemplary embodiments of the sense amplifier 80 included in the memory device of FIG. 1. Referring to FIG. 2A, the sense amplifier 80a includes a pre-charge circuit 82a, a regulation circuit 82b, and a boosting circuit 82c. The sense amplifier 80a may further include an inverter IN2.

A memory cell CELL and a bit line BL are shown at the same time for convenience of the explanation. The memory cell CELL may connect to the sense amplifier 80a through the bit line BL.

The pre-charge circuit 82a pre-charges the bit line BL in response to a pre-charge signal PRE. The pre-charge circuit 82a may include a plurality of pre-charge transistors PP1 and PP2. The pre-charge transistor PP1 is connected between a power line PL providing a power voltage VDD and an output terminal n3. The pre-charge transistor PP1 may provide a power voltage VDD to pre-charge the bit line BL into the output terminal n3 when a pre-charge signal PRE is in low activation.

The pre-charge transistor PP2 is connected between the power line PL and a boosting circuit 82c. The pre-charge transistor PP2 may provide a power voltage VDD to pre-charge the bit line BL into the boosting circuit 82C when a pre-charge signal PRE is in low activation.

The regulation circuit 82b determines a logic level of the output terminal n3 according to a voltage of the bit line BL, for example, a voltage of a node n1. The regulation circuit 82b is connected between the output terminal n3 and the bit line BL. The regulation circuit 82b includes a regulation transistor NR1 and an inverter IN1.

The inverter IN1 inverts a logic level of the voltage of the node n1 and outputs the inverted signal into a node n2. The inverted signal is provided into a gate of the regulation transistor NR1, and the regulation transistor NR1 may select whether a current path should be formed between the output terminal n3 and the node n1 or not, for example, performs switching, according to the inverted signal.

The boosting circuit 82c may boost the bit line BL to a boosting voltage during a pre-charge operation pre-charging the bit line BL. The boosting circuit 82c is connected between the pre-charge circuit 82a and the node n1. The boosting circuit 82c includes a boosting transistor PB1, wherein the boosting transistor PB1 may be a diode connected transistor. The inverter IN2 inverts a logic level of a voltage of the output terminal n3 and outputs the inverted signal as a detecting signal Dout.

Figure 2B:
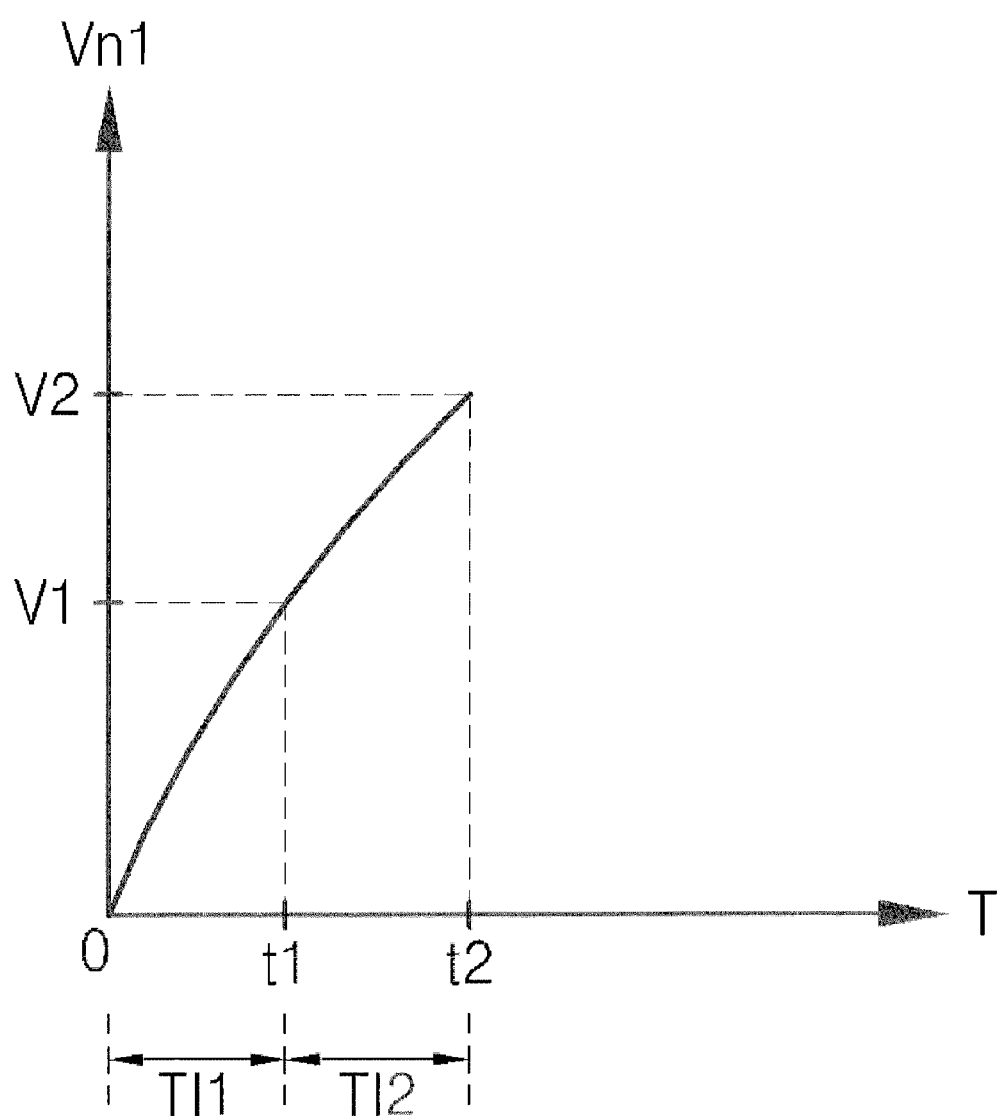
FIG. 2B is a graph explaining a pre-charge operation of the sense amplifier shown in FIG. 2A.

FIG. 2B is a graph explaining a pre-charge operation of the sense amplifier shown in FIG. 2A. Referring to FIGS. 2A and 2B, the graph shown in FIG. 2B is a graph related to a voltage Vn1 of the node n1 according to the time T during a pre-charge operation.

A first time period TI1 is a period from the time T of 0 to a first time point t1, and a second time period TI2 is a period from the first time point t1 to a second time point t2. A power voltage VDD is provided to the bit line BL through the pre-charge transistor PP1 and the regulation transistor NR1 during the first time period TI1, and at the same time, the power voltage VDD is provided to the bit line BL through the pre-charge transistor PP2 and the boosting transistor PB1.

The voltage of the bit line BL, for example, the voltage of the node n1, may be pre-charged to a first voltage V1 during the first time period TI1. When a voltage of the bit line BL, for example, a voltage of the node n1 becomes a trigger point voltage of the inverter IN1, for example, the first voltage V1, the inverter IN1 inverts a logic level of the first voltage V1 into a low level and provides the inverted signal to the regulation transistor NR1.

At this time, the trigger point voltage of the inverter IN1 may denote a voltage as a reference of inversion in the inverter IN1. In this case, the regulation transistor NR1 may be switched such that a current may not flow between the output terminal n3 and the node n1. That is, the power voltage VDD provided through the pre-charge transistor PP1 and the regulation transistor NR1 may be stopped.

The power voltage VDD is provided to the bit line BL through the pre-charge transistor PP2 and the boosting transistor PB1 during the second time period TI2. The bit line BL may be boosted to a boosting voltage, for example, a second voltage V2.

Figure 2C:
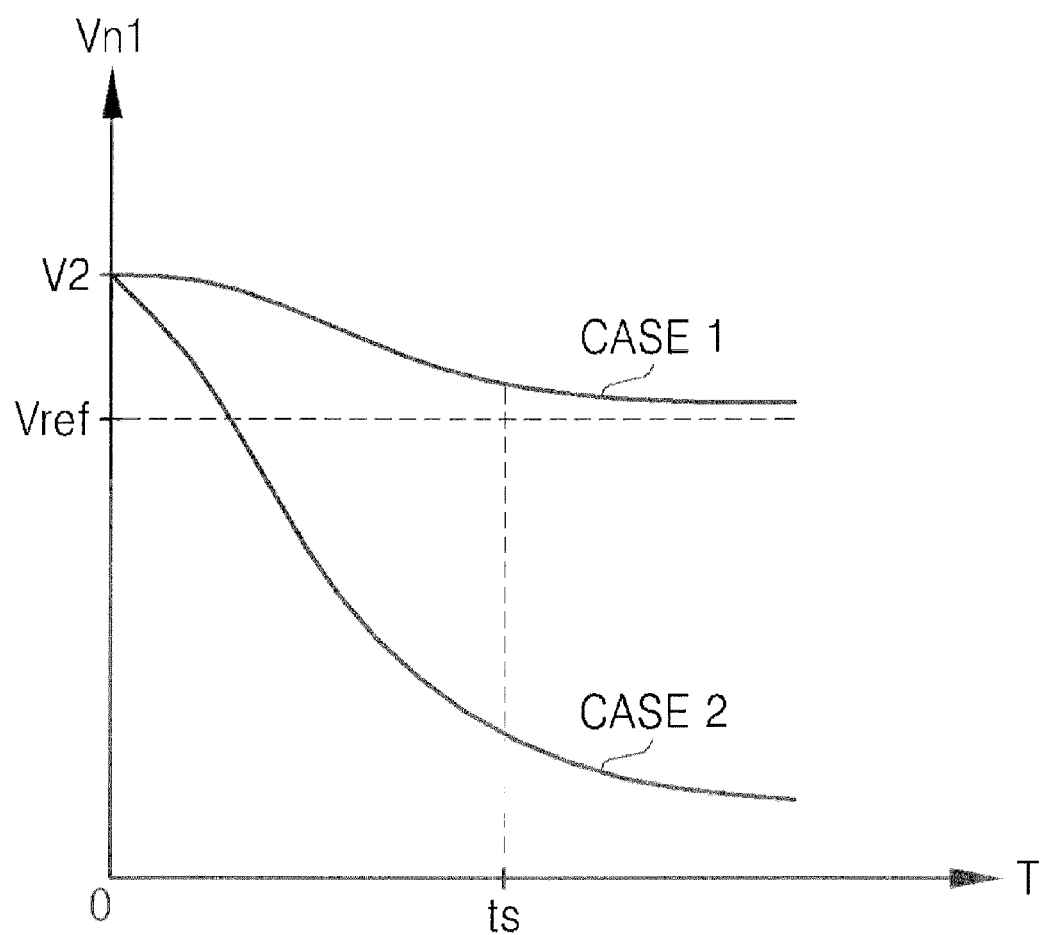
FIG. 2C is a graph explaining a sensing operation of the sense amplifier shown in FIG. 2A.

FIG. 2C is a graph explaining a sensing operation of the sense amplifier shown in FIG. 2A. Referring to FIGS. 2A and 2C, the graph shown in FIG. 2C is a graph related to a voltage Vn1 of the node n1 according to the time T during a sensing operation. CASE 1 is a graph related to a voltage Vn1 of the node n1 in the case where a state of the memory cell CELL is off-cell.

When a state of the memory cell CELL is off-cell, a current may not flow through the memory cell CELL, and thus, a variation of the voltage Vn1 of the node 1 is slight.

The voltage Vn1 of the node n1 at the sensing point ts is greater than a reference voltage Vref, and accordingly, a logic level of the voltage Vn1 at this point may be recognized as a high level. The inverter IN1 inverts the logic level and outputs the inverted signal, that is, outputs a low level signal into the node n2. The inverted signal is provided to the gate of the regulation transistor NR1, and the regulation transistor NR1 is switched such that a current may not flow between the output terminal n3 and the node n1.

At this time, the voltage of the output terminal n3 may be maintained as a voltage provided through a pre-charge operation, for example, as VDD. The inverter IN2 inverts a logic level of the voltage of the output terminal n3 into a low level and outputs the inverted signal, that is, the low level signal, as a detecting signal Dout.

CASE 2 is a graph related to a voltage Vn1 of the node n1 in the case where a state of the memory cell CELL is on-cell. When a state of the memory cell CELL is on-cell, a current flows through the memory cell CELL, and thus, a variation of the voltage Vn1 of the node n1 is considerable.

The voltage Vn1 of the node n1 at the sensing point ts is lower than the reference voltage Vref, and accordingly, a logic level of the voltage Vn1 may be recognized as a low level. The inverter IN1 inverts the logic level and outputs the inverted signal, that is, outputs the high level signal into the node n2.

The inverted signal is provided into the gate of the regulation transistor NR1, and the regulation transistor NR1 is switched such that a current may flow between the output terminal n3 and the node n1.

At this time, the voltage of the output terminal n3 may be lower than a trigger point voltage as a reference of inversion of the inverter IN2. The inverter IN2 inverts a logic level of the voltage of the output terminal n3 into a high level and outputs the inverted signal, that is, a high level signal, as a detecting signal Dout.

Figure 3:
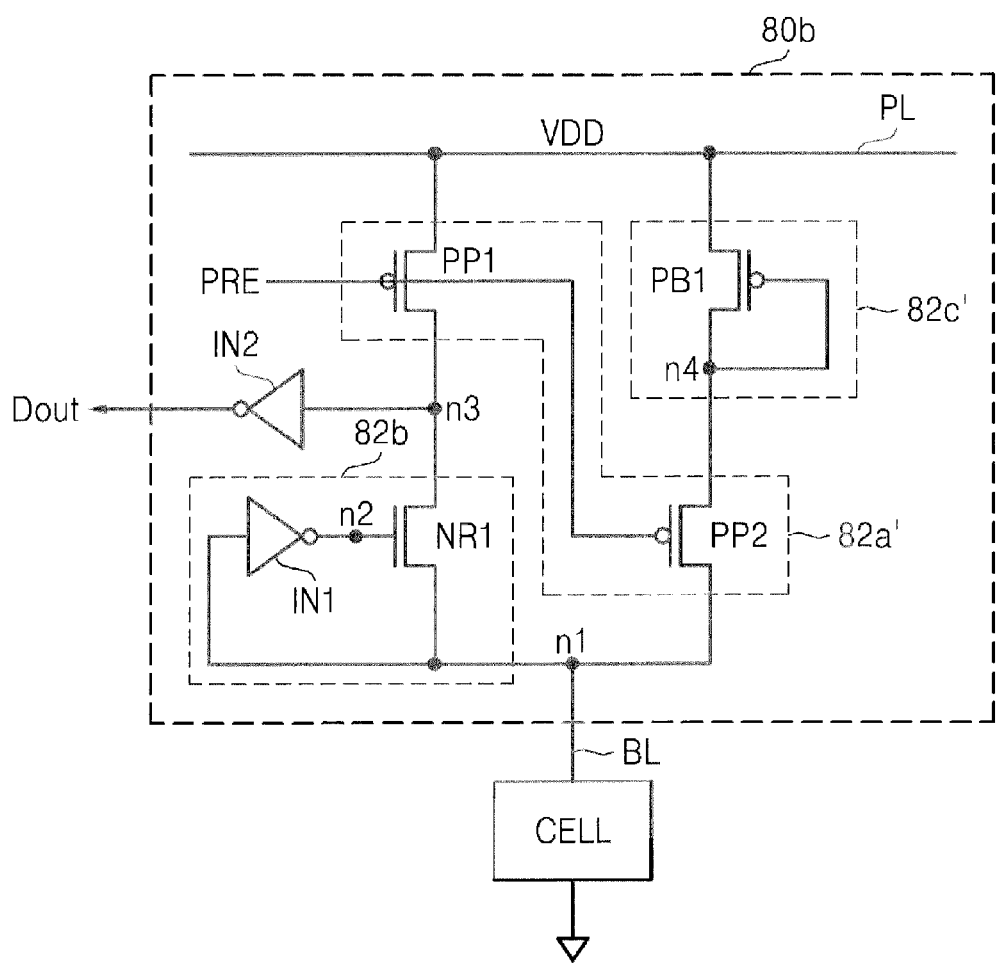
FIG. 3 is a circuit diagram according to another exemplary embodiment of the sense amplifier included in the memory device shown in FIG. 1.

FIG. 3 is a circuit diagram according to another exemplary embodiment of the sense amplifier included in the memory device shown in FIG. 1. Referring to FIG. 3, the sense amplifier 80b includes a pre-charge circuit 82a', a regulation circuit 82b, and a boosting circuit 82c'. The sense amplifier 80b may further include an inverter IN2.

A memory cell CELL and a bit line BL are shown at the same time for convenience of explanation. The memory cell CELL may be connected to the sense amplifier 80b through the bit line BL.

The pre-charge circuit 82a' pre-charges the bit line BL in response to a pre-charge signal PRE. The pre-charge circuit 82a' includes a plurality of pre-charge transistors (PP1 and PP2). The pre-charge transistor PP1 is connected between a power line PL and an output terminal n3, and the pre-charge transistor PP2 is connected between the boosting circuit 82c' and the bit line BL. The pre-charge transistor PP2 provides a power voltage VDD provided by the boosting circuit 82c' to the bit line BL.

The boosting circuit 82c' boosts the bit line BL to a boosting voltage during a pre-charge operation pre-charging the bit line BL. The boosting circuit 82c' is connected between the power line PL and the pre-charge circuit 82a'.

An operation of the sense amplifier 80b shown in FIG. 3 is actually the same as the operation of the sense amplifier 80a shown in FIG. 2A, thus, explanation thereof is omitted herewith.

Figure 4A:
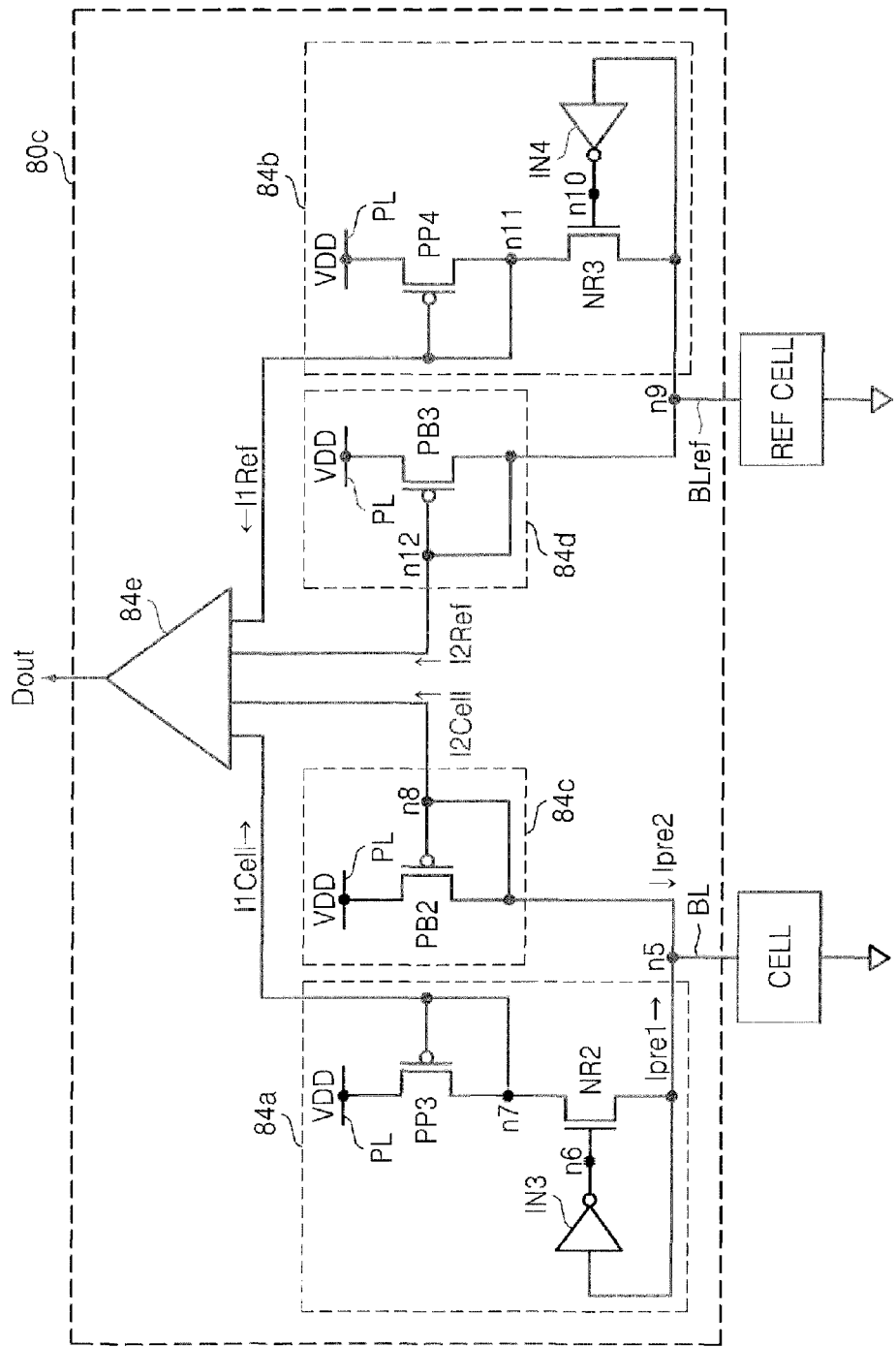
FIG. 4A is a circuit diagram according to yet another exemplary embodiment of the sense amplifier included in the memory device shown in FIG. 1.

FIG. 4A is a circuit diagram of the sense amplifier included in the memory device shown in FIG. 1 according to yet another exemplary embodiment. Referring to FIG. 4A, the sense amplifier 80c includes a control circuit 84a, a control circuit 84b, a boosting circuit 84c, a boosting circuit 84d, and a detecting circuit 84e.

A memory cell CELL, a reference memory cell REF CELL, a bit line BL, and a reference bit line BLref are shown at the same time for convenience of explanation. Each of the memory cell CELL and the reference memory cell REF CELL may connect to the sense amplifier 80c through each of the bit line BL and the reference bit line BLref, respectively.

The control circuit 84a controls a pre-charge current Ipre1 provided to the bit line BL through the control circuit 84a according to a voltage of the bit line BL, for example, a voltage of a node n5, during a pre-charge operation pre-charging the bit line BL.

The control circuit 84a includes a pre-charge transistor PP3, an inverter IN3, and a regulation transistor NR2. The pre-charge transistor PP3 is connected between a power line PL providing a power voltage VDD and the regulation transistor NR2. The pre-charge transistor PP3 may be a diode connected transistor. The pre-charge transistor PP3 provides a power voltage VDD to a node n7 during a pre-charge operation.

The inverter IN3 inverts a voltage of the bit line BL, for example, a logic level of a voltage of the node n5, and outputs the inverted signal to a node n6. The inverted signal is provided to a gate of the regulation transistor NR2, and the regulation transistor NR2 determines whether to allow current flow between the node n5 and the node n7, according to the inverted signal, for example, provides a switching operation.

The control circuit 84b includes a pre-charge transistor PP4, an inverter IN4, and a regulation transistor NR3. A structure and an operation of the control circuit 84b are actually the same as the structure and the operation of the control circuit 84a, and thus, an explanation thereof is omitted.

The boosting circuit 84c boosts the bit line BL to a boosting voltage during the pre-charge operation pre-charging the bit line BL. The boosting circuit 84c is connected between the power line PL and the node n5. The boosting circuit 84c includes a boosting transistor PB2, and the boosting transistor PB2 may be a diode connected transistor.

A structure and an operation of the boosting circuit 84d are actually the same as the structure and the operation of the boosting circuit 84c, and thus, explanations thereof are omitted herein. The detecting circuit 84e compares a current related to a state of the memory cell CELL and a current related to a status of the reference memory cell REF CELL and detects a state of the memory cell CELL according to the result of the comparison. The detecting circuit 84e outputs a detecting signal Dout according to the result of the detection. At this time, the state of the memory cell CELL may denote on-cell or off-cell.

The current related to the state of the memory cell CELL may be the sum of a cell sensing current I1Cell and a cell sensing current I2Cell, and the current related to the state of the reference memory cell REF CELL may be the sum of a reference detecting current I1 Ref and a reference detecting current I2Ref.

Figure 4B:
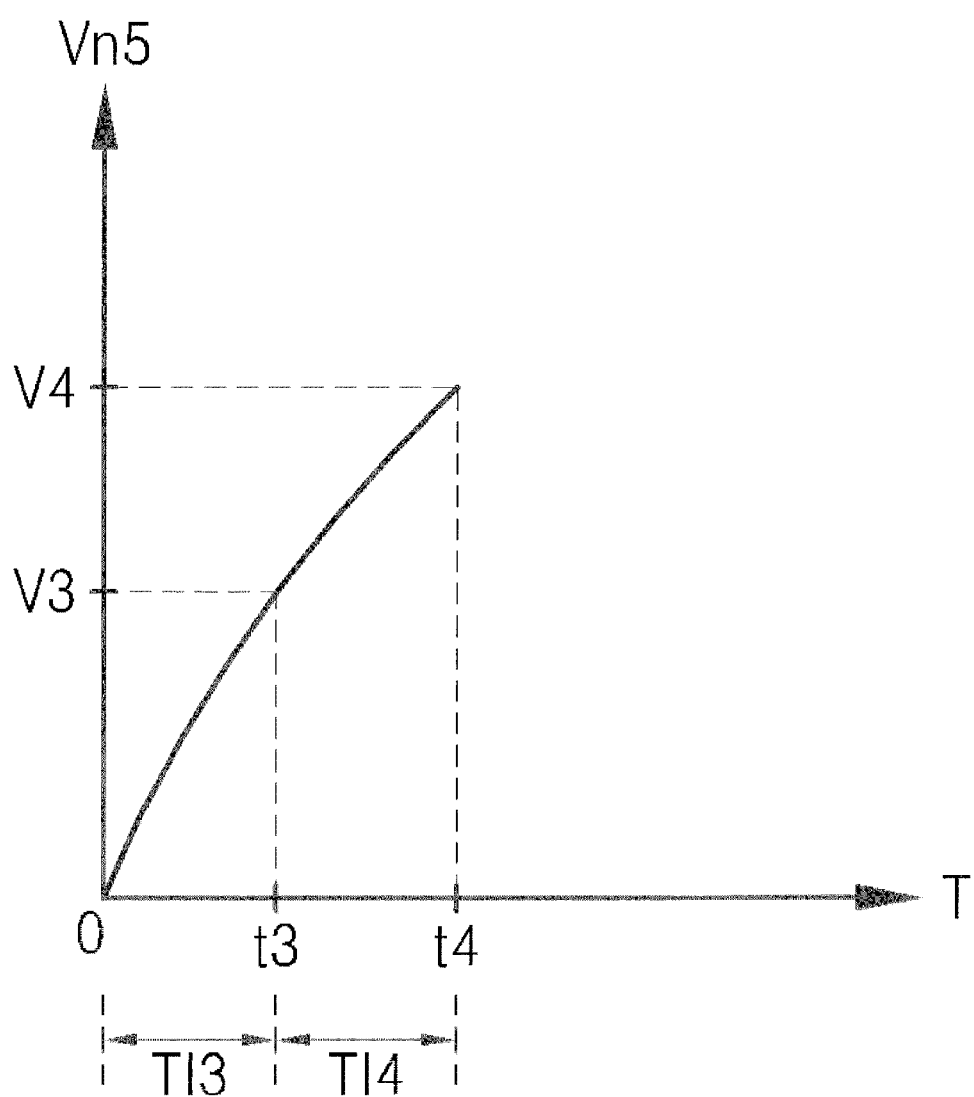
FIG. 4B is a graph explaining a pre-charge operation of the sense amplifier shown in FIG. 4A.

FIG. 4B is a graph explaining a pre-charge operation of the sense amplifier shown in FIG. 4A. Referring to FIGS. 4A and 4B, the graph shown in FIG. 4B is a graph related to a voltage Vn5 of the node n5 according to the time T during the pre-charge operation.

A third time period TI3 is a period from T of 0 to T of a third time point t3, and a fourth time period TI4 is a period from the third time point t3 to a fourth time point t4. A pre-charge current Ipre1 may be provided to the bit line BL through the pre-charge transistor PP3 and the regulation transistor NR2, and a pre-charge current Ipre2 may be provided to the bit line BL through the boosting transistor PB2 during the third time period TI3. A voltage of the bit line BL, for example, a voltage of the node n5, may be pre-charged up to a third voltage V3 during the third time period TI3.

When a voltage of the bit line BL, for example, a voltage of the node n5, is a trigger point voltage of the inverter IN3, for example, the third voltage V3, the inverter IN3 inverts a logic level of the third voltage V3 into a low level and provides the inverted signal to the regulation transistor NR2. At this time, the regulation transistor NR2 may be switched such that a current may not flow between the node n7 and the node n5. That is, providing the pre-charge current Ipre1 through the pre-charge transistor PP3 and the regulation transistor NR2 may be stopped.

The pre-charge current Ipre2 is provided to the bit line BL through the boosting transistor PB2 during the fourth time period TI4. The bit line BL may be boosted up to a boosting voltage, for example, the fourth voltage V4 during the fourth period TI4. A voltage of a node n9 may be changed in the same way as the voltage Vn5 of the node n5.

Figure 4D:
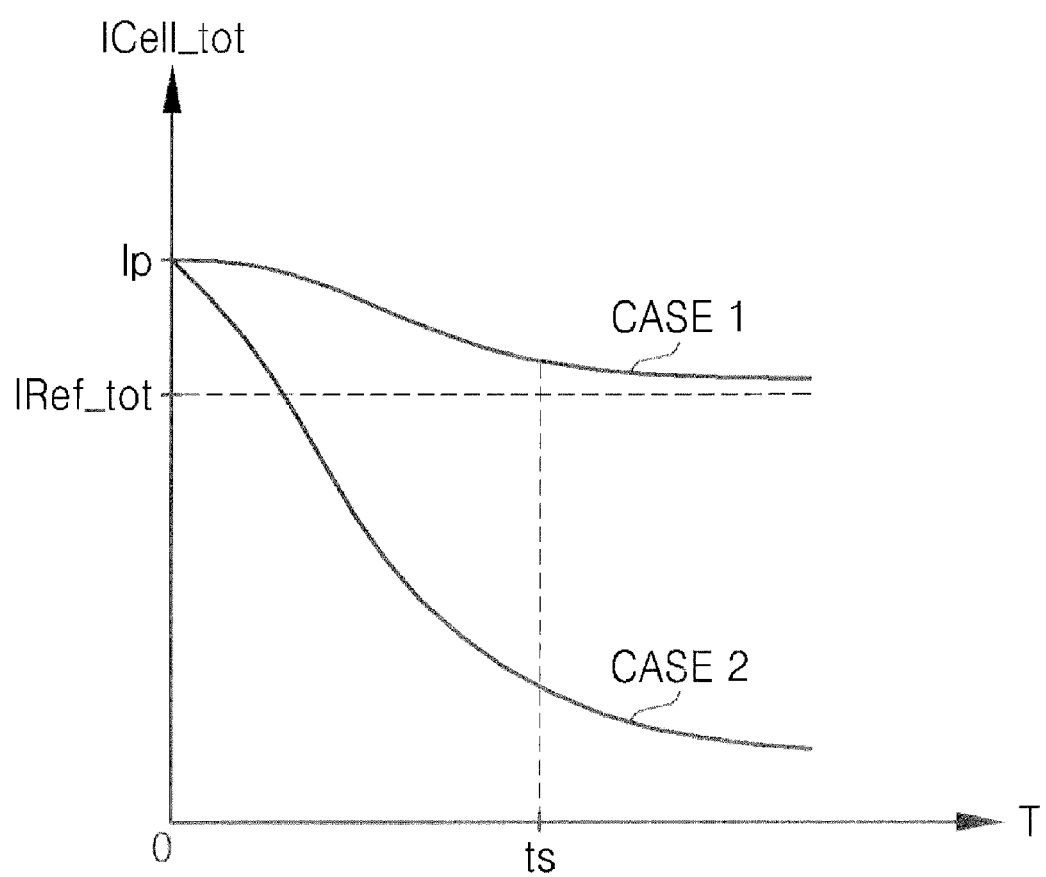
FIG. 4D is a graph explaining a sensing operation shown in FIG. 4A.

FIG. 4C is a circuit diagram of a detecting circuit included in the sense amplifier shown in FIG. 4A. FIG. 4D is a graph explaining a sensing operation of the sense amplifier shown in FIG. 4A. Referring to FIGS. 4A, 4C, and 4D, the graph of FIG. 4D is a graph related to a cell current ICell_tot according to the time T during the sensing operation.

The cell current ICell_tot may be the sum of the cell sensing current I1Cell and the cell sensing current I2Cell, and the reference current IRef_tot may be the sum of the reference sensing current I1Ref and the reference sensing current I2Ref.

CASE 1 is a graph related to the cell current ICell_tot when a state of the memory cell CELL is on-cell. When a state of the memory cell CELL is on-cell, a current flows through the memory cell CELL, thus, the cell current ICell_tot may not change from an initial current Ip considerably. At this time, the cell current ICell_tot is greater than the reference current IRef_tot at the sensing point ts.

A mirror current Imirror flows at the same current with the reference current IRef_tot according to a feature of the mirror circuit CM. Thus, the cell current ICell_tot is greater than the mirror current Imirror. When the cell current ICell_tot is greater than the mirror current Imirror, a logic level of a voltage of an output terminal nout may be a high level. That is, when the state of the memory cell CELL is on-cell, a detecting signal Dout may be a high level.

CASE 2 is a graph related to the cell current ICell_tot when a state of the memory cell CELL is off-cell. When a state of the memory cell CELL is off-cell, a current may not flow through the memory cell CELL, and thus, the cell current ICell_tot changes from the initial current Ip considerably. At this time, the cell current ICell_tot is smaller than the reference current IRef_tot at the sensing time point ts.

The mirror current Imirror flows at the same current with the reference current IRef_tot according to the feature of the mirror circuit CM. Thus, the cell current ICell_tot is smaller than the mirror current Imirror.

When the cell current ICell_tot is smaller than the mirror current Imirror, a logic level of a voltage of an output terminal nout may be a low level. That is, when the state of the memory cell CELL is off-cell, a detecting signal Dout may be a low level.

Figure 5A:
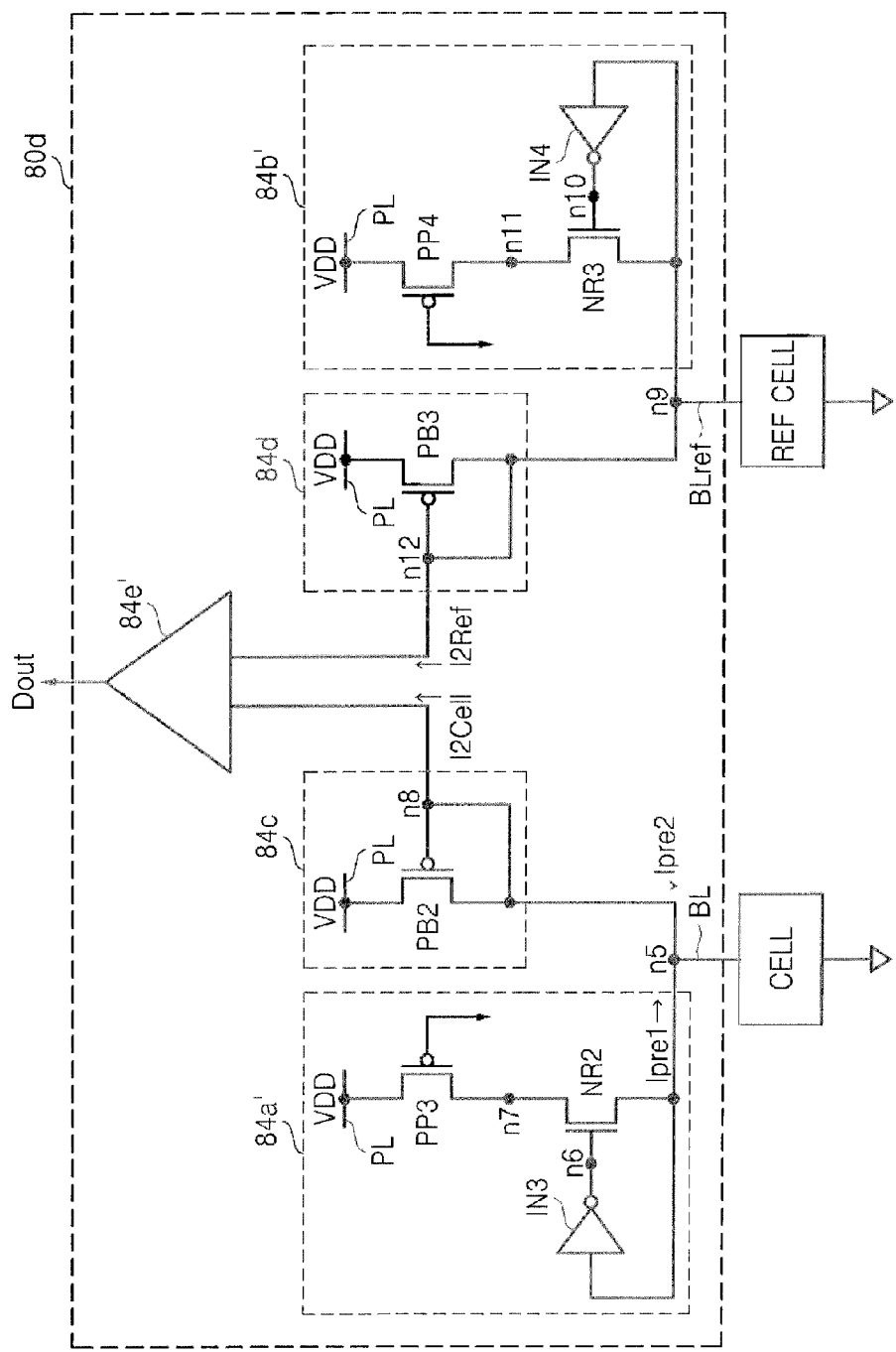
FIG. 5A is a circuit diagram according to another exemplary embodiment of the sense amplifier of the memory device shown in FIG. 1.

FIG. 5A is a circuit diagram according to yet another exemplary embodiment of the sense amplifier included in the memory device shown in FIG. 1. Referring to FIG. 5A, the sense amplifier 80d includes a control circuit 84a', a control circuit 84b', a boosting circuit 84c, a boosting circuit 84d, and a detecting circuit 84e'.

A memory cell CELL, a reference memory cell REF CELL, a bit line BL, and a reference bit line BLref are shown at the same time for convenience of explanation. Each of the memory cell CELL and the reference memory cell REF CELL is connected to the sense amplifier 80d through each of the bit line BL and the reference bit line BLref, respectively.

A gate of a pre-charge transistor PP3 included in the control circuit 84a' is connected to a ground. A gate of a pre-charge transistor PP4 included in the control circuit 84b' is connected to a ground. The detecting circuit 84e' compares a current related to the state of the memory cell CELL and a current related to the state of the reference memory cell REF CELL and detects a state of the memory cell CELL according to the comparison result. The detecting circuit 84e outputs a detecting signal Dout according to the detecting result.

The current related to the state of the memory cell CELL is a cell sensing current I2Cell, and the current related to the state of the reference memory cell REF CELL is a reference sensing current I2Ref. A structure and an operation of the sense amplifier 80d shown in FIG. 5A except the above described features are actually the same as the structure and the operation of the sense amplifier 80c shown in FIG. 4A.

Figure 5B:
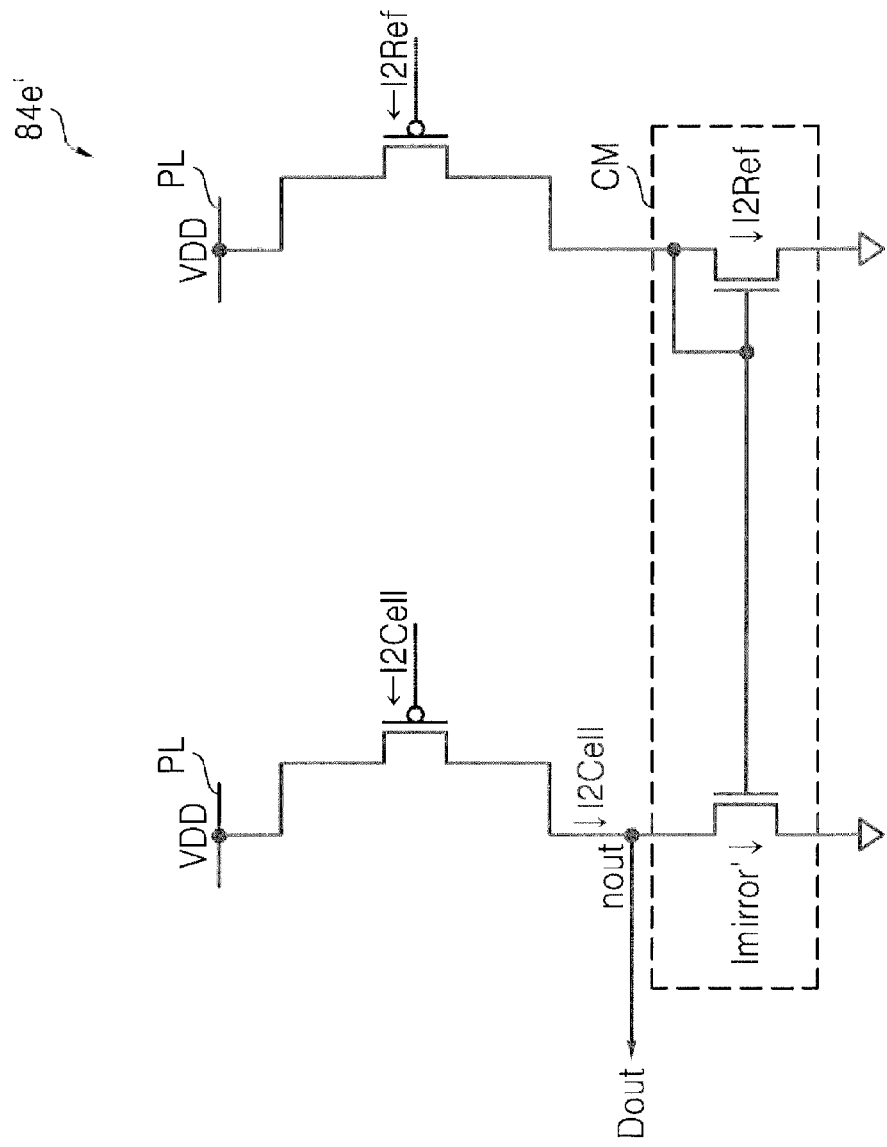
FIG. 5B is a circuit diagram according to an exemplary embodiment of a detecting circuit included in the sense amplifier shown in FIG. 5A.

FIG. 5B is a circuit diagram of a detecting circuit included in the sense amplifier shown in FIG. 5A. Referring to FIG. 5B, the detecting circuit 84e' outputs a detecting signal Dout according to the result of comparison between the cell sensing current I2Cell and the reference sensing current I2Ref.

A mirror current Imirror' flows at the same current with the reference sensing current I2Ref according to a feature of a mirror circuit CM. When the cell sensing current I2Cell is smaller than the mirror current Imirror, a logic level of a voltage of an output terminal nout is a low level. At this time, a detecting signal Dout may be a low level. When the cell sensing current I2Cell is greater than the mirror current Imirror, a logic level of a voltage of an output terminal nout may be a high level. At this time, a detecting signal Dout may be a high level.

FIG. 6 is a block diagram of a memory system including the memory device shown in FIG. 1. Referring to FIG. 6, the memory system 200 includes a memory device 100 connected to a data bus 210, a processor 220, a first interface 230, and a second interface 240.

According to an exemplary embodiment, the memory system 200 includes a portable device such as a cell phone, an MP3 player (MPEG Audio Layer-3 player), an MP4 player (MPEG Audio layer-4 player), a personal digital assistant (PDA), a portable media player (PMP), or the like. According to another exemplary embodiment, the memory system 200 includes a data processing system such as a personal computer (PC), a notebook-sized personal computer, a laptop computer, or the like.

According to yet another exemplary embodiment, the memory system 200 includes a memory card such as a secure digital (SD) card, a multi media card (MMC), or the like.

According to still another exemplary embodiment, the memory system 200 includes a smart card or solid state drive (SSD).

The memory device 100 and the processor 220 may be embodied into a single chip, for example, a system on chip (SoC) and may be embodied into separate devices in some embodiments. The processor 220 may process data input through the first interface 230 and write the processed data on the memory device 100. The processor may read data stored in the memory device 100 and output the read data through the first interface 230. At this time, the first interface 230 may be an input/output device.

The second interface 240 may be an interface for wireless communication. The second interface 240 may be embodied in software or firmware.

The devices according to an exemplary embodiment have an effect of enabling to operate under the condition that a low voltage is provided by using the sense amplifier including the boosting circuit.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An integrated circuit comprising:
   a memory cell;
   a bit line connected to the memory cell;
   a boosting circuit boosting the bit line to a boosting voltage during a pre-charge operation pre-charging the bit line; and
   a regulation circuit connected between the bit line and an output terminal and determines a logic level of the output terminal according to a voltage of the bit line,
   wherein the regulation circuit comprises a regulation transistor and an inverter, the output of the inverter connected to a gate of the regulation transistor.

2. The integrated circuit of claim 1, where the integrated circuit further comprises:
   a pre-charge circuit for pre-charging the bit line in response to a pre-charge signal, the pre-charge circuit comprising:
   a first pre-charge transistor connected between a power line providing a power voltage and the output terminal; and
   a second pre-charge transistor connected between the power line and the boosting circuit.

3. The integrated circuit of claim 2, wherein the regulation circuit comprises:
   a regulation transistor connected between the bit line and the output terminal; and
   an inverter connected between the bit line and a gate of the regulation transistor.

4. The integrated circuit of claim 1, wherein the integrated circuit further comprises:
   a pre-charge circuit to pre-charge the bit line in response to a pre-charge signal, the pre-charge circuit comprising:
   a first pre-charge transistor connected to a power line providing a power voltage and the output terminal; and
   a second pre-charge transistor connected between the bit line and the boosting circuit.

5. The integrated circuit of claim 4, wherein the regulation circuit comprises:
   a regulation transistor connected between the bit line and the output terminal; and
   an inverter connected between the bit line and a gate of the regulation transistor.

6. The integrated circuit of claim 1, wherein the memory cell is a NOR flash memory cell.

7. A system on chip (SoC) comprising:
   the integrated circuit of claim 1; and
   a processor controlling the integrated circuit.

8. An integrated circuit comprising:
   a first bit line connected to a memory cell;
   a first control circuit controlling a first pre-charge current provided to the first bit line according to a voltage of the first bit line during a pre-charge operation pre-charging the first bit line;
   a first boosting circuit to boost the first bit line to a first boosting voltage; and
   a detecting circuit detecting a state of the memory cell according to the result of a comparison between a first current related to the state of the memory cell and a second current related to a state of a reference memory cell during a sensing operation detecting the state of the memory cell, wherein the integrated circuit further comprises:
   a second bit line connected to the reference memory cell;
   a second control circuit controlling a second pre-charge current provided to the second bit line according to a voltage of the second bit line during the pre-charge operation pre-charging the second bit line; and
   a second boosting circuit to boost the second bit line to a second boosting voltage.

9. The integrated circuit of claim 8, wherein the first current is the sum of a current flowing through the first control circuit and a current through the first boosting circuit during the sensing operation, and
   wherein the second current is the sum of a current flowing through the second control circuit and a current flowing through the second boosting circuit during the sensing operation.

10. The integrated circuit of claim 8, wherein the first boosting circuit includes a boosting transistor connected to a power line providing a power voltage and the first bit line,
    wherein a gate of the boosting transistor is connected to the detecting circuit, and
    the second boosting circuit has the same structure as the first boosting circuit.

11. The integrated circuit of claim 10, wherein the boosting transistor is a diode connected transistor.

12. The integrated circuit of claim 8, wherein the first control circuit comprising:
    a pre-charge transistor connected to a power line providing a power voltage;
    a regulation transistor connected between the pre-charge transistor and the first bit line; and
    an inverter connected between a gate of the regulation transistor and the first bit line, and
    wherein a gate of the pre-charge transistor is connected to the detecting circuit, and the second control circuit has same structure with the first control circuit.

13. The integrated circuit of claim 8, wherein the first control circuit comprising:
    a pre-charge transistor connected to a power line providing a power voltage;
    a regulation transistor connected between the pre-charge transistor and the first bit line; and
    an inverter connected between a gate of the regulation transistor and the first bit line, and
    wherein a gate of the pre-charge transistor is connected to a ground, and the second control circuit has same structure with the first control circuit.

14. A system on chip (SoC) comprising:
the integrated circuit of claim 8; and
a processor to control the integrated circuit.

15. An integrated circuit, comprising:
a bit line provide data to a memory cell;
a boosting circuit to boost the bit line during a pre-charge operation pre-charging the bit line; and
a regulation circuit connected between the bit line and an output terminal to determine a logic level of the output terminal according to a voltage level of the bit line, wherein the regulation circuit comprises a regulation transistor and an inverter, the output of the inverter connected to a gate of the regulation transistor.

16. The integrated circuit of claim 15, further comprising:
a pre-charge circuit to pre-charge the bit line in response to a pre-charge signal, the pre-charge circuit comprising:
   a first pre-charge transistor connected between a power line providing a power voltage and the output terminal; and
   a second pre-charge transistor connected between the power line and the boosting circuit.

17. The integrated circuit of claim 16, wherein the boosting circuit is connected between the pre-charge circuit and the bit line.

18. The integrated circuit of claim 17, wherein the pre-charge circuit includes a transistor connected between a power line and the boosting circuit.

* * * * *